(12) United States Patent
Murayama et al.

(10) Patent No.: US 8,622,556 B2
(45) Date of Patent: Jan. 7, 2014

(54) FRAME-ATTACHED ANTI-REFLECTION GLASS AND METHOD OF MANUFACTURING THE SAME

(75) Inventors: Kei Murayama, Nagano (JP); Akinori Shiraishi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 137 days.

(21) Appl. No.: 13/329,572

(22) Filed: Dec. 19, 2011

(65) Prior Publication Data

US 2012/0154918 A1  Jun. 21, 2012

(30) Foreign Application Priority Data

Dec. 21, 2010 (JP) .................................. 2010-285078

(51) Int. Cl.
  *G02B 27/00* (2006.01)
  *G02B 1/11* (2006.01)
(52) U.S. Cl.
  CPC ...................................... *G02B 1/11* (2013.01)
  USPC ....................................................... 359/614
(58) Field of Classification Search
  None
  See application file for complete search history.

(56) References Cited

U.S. PATENT DOCUMENTS

| 5,616,949 A | 4/1997 | Watanabe |
| 2004/0071969 A1 | 4/2004 | Okamoto |
| 2006/0131600 A1 | 6/2006 | Nakaoka |
| 2008/0024867 A1 | 1/2008 | Kawashima |
| 2009/0206349 A1 | 8/2009 | Yamada |
| 2010/0230697 A1 | 9/2010 | Koehler et al. |

FOREIGN PATENT DOCUMENTS

| EP | 1882678 | 1/2008 |
| JP | 2000-267192 | 9/2000 |
| JP | 2009-170723 A1 | 7/2009 |
| JP | 2010-537411 | 12/2010 |
| WO | WO 2008/023824 A1 | 2/2008 |

OTHER PUBLICATIONS

European Search Report issued for counterpart European Patent Application No. 11194567.1 dated Jun. 1, 2012.

*Primary Examiner* — Derek S Chapel
(74) *Attorney, Agent, or Firm* — Kratz, Quintos & Hanson, LLP

(57) ABSTRACT

A frame-attached anti-reflection glass (a cap for optical device) includes a plate-shaped member including an anti-reflection film formed on at least one surface of a plate-shaped glass, and a frame-shaped member made of silicon joined to a peripheral portion on one surface side of the plate-shaped member. The anti-reflection film includes two partial films having different compositions, and one partial film is a light-absorbent film. The two partial films are continuously formed on the plate-shaped glass, and respective surfaces of each partial film are on a level with each other. The plate-shaped glass and the frame-shaped member (silicon) are joined together by anodic bonding.

5 Claims, 11 Drawing Sheets

EMBODIMENT

COMPARATIVE EXAMPLE

FRAME-ATTACHED ANTI-REFLECTION GLASS AND METHOD OF MANUFACTURING THE SAME

CROSS-REFERENCE TO RELATED APPLICATION

This application is based upon and claims the benefit of priority of the prior Japanese Patent Application No. 2010-285078, filed on Dec. 21, 2010, the entire contents of which are incorporated herein by reference.

FIELD

The embodiments discussed herein are related to a frame-attached anti-reflection glass and a method of manufacturing the same. Such a frame-attached anti-reflection glass can be preferably used, for example, as a cap for sealing an optical device such as a light emitting element or the like mounted on a substrate.

BACKGROUND

As one form of a cap for optical device, there is a structure obtained by joining a silicon to a borosilicate glass by anodic bonding. FIG. 3B illustrates an example of the structure, in which a frame-shaped member 18 made of silicon is joined to a peripheral portion on one surface of a plate-shaped borosilicate glass 13. Reference numeral 20 denotes an optical device (light emitting element in the illustrated example) disposed in a cavity formed by the plate-shaped member (borosilicate glass) 13 and the frame-shaped member 18.

As the art related to sealing of such an optical device, for example, there is known a light emitting device described in Patent document 1 (Japanese Laid-open Patent Publication No. 2009-170723). As another related art, there is known a semiconductor device described in Patent document 2 (Japanese National Publication of International Patent Application No. 2008-0238241)

As illustrated in FIG. 3B, in the configuration of the cap 10a for optical device according to the state of the art, the interfaces of the borosilicate glass (plate-shaped member) 13 and the silicon (frame-shaped member) 18 are covalent bonded by anodic bonding. Accordingly, the joined portion of the glass 13 and the silicon 18 is optically transparent. As a result, problems arise in that unnecessary reflection of light occurs at a portion of the glass on the joined portion and thus the optical characteristics are deteriorated. The particular of the problems will be explained in connection with the embodiments as described later.

SUMMARY

According to one aspect of the invention, there is provided a frame-attached anti-reflection glass including a plate-shaped member including an anti-reflection film formed on at least one surface of a plate-shaped glass, and a frame-shaped member made of silicon joined to a peripheral portion on one surface side of the plate-shaped member, wherein the anti-reflection film includes two partial films having different compositions, one of the two partial films being a light-absorbent film, and wherein the two partial films are continuously formed on at least one surface of the plate-shaped glass, and respective surfaces of each partial film are on a level with each other.

According to another aspect of the invention, there is provided a method of manufacturing a frame-attached anti-reflection glass, including preparing a plate-shaped member including an anti-reflection film formed on one surface of a plate-shaped glass, and a frame-shaped member made of silicon, superposing the frame-shaped member on a surface of the plate-shaped member on a side on which the plate-shaped glass is formed, and joining the plate-shaped glass and the frame-shaped member together by anodic bonding with an application of bias voltage, while forming a light-absorbent film in a portion of the anti-reflection film corresponding to a position of the frame-shaped member.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the accompanying drawings.

First Embodiment

Figure 1:
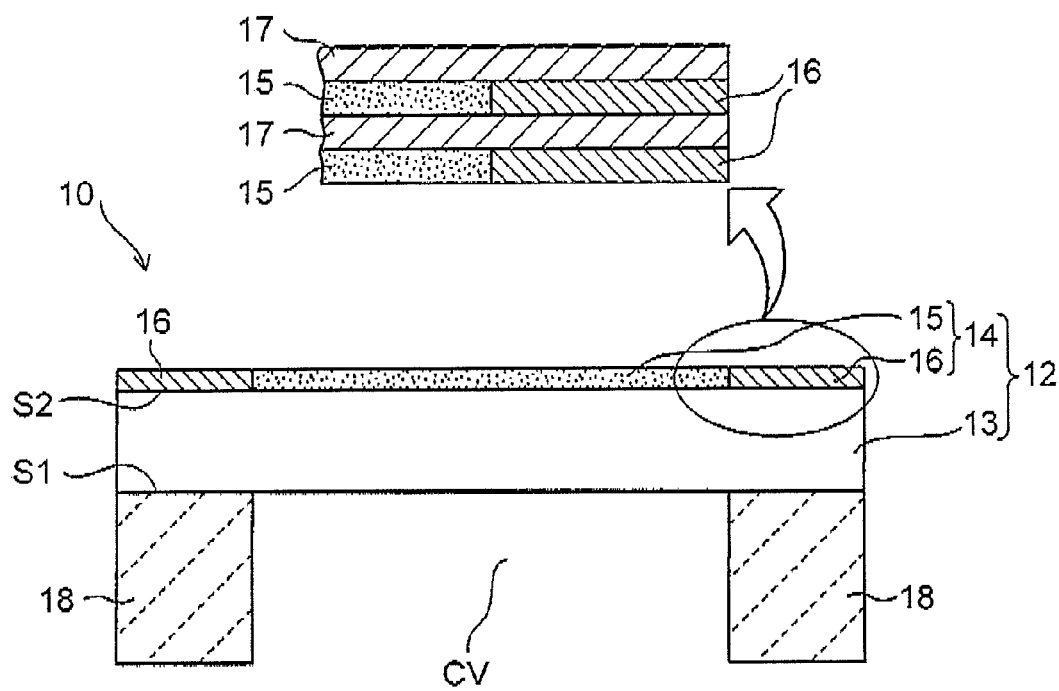
FIG. 1 is a cross-sectional view illustrating a configuration of a cap for optical device (frame-attached anti-reflection glass) according to a first embodiment.

FIG. 1 illustrates in a cross-sectional view, a configuration of a cap for optical device as the frame-attached anti-reflection glass according to a first embodiment. The cap for optical device according to the embodiment is used to seal an optical device such as a light emitting element or the like mounted on a substrate as described later.

The cap 10 for optical device of the embodiment has a concave structure when viewed in a vertical cross section as illustrated in FIG. 1. More specifically, the cap 10 has a structure in which a frame-shaped member 18 is joined to a peripheral portion on one surface side of a plate-shaped member 12. Although not illustrated in FIG. 1, the shape of the plate-shaped member 12 when viewed in plan from the upper direction thereof is, for example, a square shape. In this case, the frame-shaped member 18 is formed in a square ring shape so as to match the outer shape of the plate-shaped member 12. It is of course that the shape of the plate-shaped member 12 when viewed in plan from the upper direction thereof is not restricted to a square shape. For example, the shape of the plate-shaped member 12 may be a circular shape. In this case, the frame-shaped member 18 is formed in a circular ring shape so as to match the outer shape of the plate-shaped member 12. Moreover, the square or circular ring is not necessarily closed in a loop, and may be a partially-opened discontinuous shape. A cavity CV of rectangular parallelepiped shape is formed by the plate-shaped member 12 and the frame-shaped member 18, and an optical device is housed in the cavity CV.

The plate-shaped member 12 is made of a material which can transmit light therethrough, and has a structure in which a film 14 having a function of preventing reflection of light (hereinafter referred to as "anti-reflection film") is formed on one surface of a borosilicate glass 13 (on the surface opposite to the surface to which the frame-shaped member 18 is joined). Borosilicate glass is one obtained by mixing boric acid with silicon dioxide which is the main component of a glass, and the embodiment uses the borosilicate glass 13 which contains at least sodium (Na) or lithium (Li). In the description below, the one surface of the borosilicate glass 13 which is in contact with the frame-shaped member 18 is referred to as a "first surface S1", and the other surface opposite to the first surface S1 is referred to as a "second surface S2".

The frame-shaped member 18 joined to the first surface S1 of the borosilicate glass 13 uses silicon (Si) as the material thereof. This frame-shaped member (silicon) 18 is joined to the borosilicate glass 13 by anodic bonding as described later.

The anti-reflection film 14 formed on the second surface S2 of the borosilicate glass 13 consists of two parts having different compositions. One of the two parts is a partial film 15 which is positioned above the cavity CV, and is a film containing tantalum pentaoxide ($Ta_2O_5$) as its main component. This film 15 is hereinafter also referred to as "tantalum pentaoxide contained film".

Another of the two parts is a partial film 16 which is positioned above the frame-shaped member 18, and is a film containing tantalum (Ta), sodium (Na) and oxygen (O), or a film containing tantalum (Ta), lithium (Li) and oxygen (O). This film 16 may contain sodium tantalate ($NaTaO_3$) or lithium tantalate ($LiTaO_3$). This film 16 has a function of absorbing light in addition to the function of anti-reflection. The light to be absorbed is not necessarily restricted to a visible radiation. In the description below, this film 16 is referred to as "light-absorbent film" for convenience's sake.

The two partial films 15 and 16 constituting the anti-reflection film 14 are not formed as a separate body, respectively, but are formed integrally with each other as described later. More specifically, the tantalum pentaoxide contained film 15 and the light-absorbent film 16 are continuously formed on the second surface S2 of the borosilicate glass 13, and the respective surfaces of the films 15, 16 are on a level with each other. Moreover, the tantalum pentaoxide contained film 15 and the light-absorbent film 16 may have the same thickness.

Moreover, the anti-reflection film 14 is basically sufficient to have a structure of a single layer (one-layer structure in which the tantalum pentaoxide contained film 15 and the light-absorbent film 16 are formed on the same surface). Note in the present embodiment, the anti-reflection film 14 has a four-layer structure as illustrated in an enlarged manner on the upper side in FIG. 1. More specifically, the multilayer film of a portion in the anti-reflection film 14, which is positioned above the cavity CV, has a structure in which the tantalum pentaoxide contained film 15, silicon dioxide film 17, the tantalum pentaoxide contained film 15 and silicon dioxide film 17 are laminated in sequence from the lower layer side. On the other hand, the multilayer film of a portion in the anti-reflection film 14, which is positioned above the frame-shaped member 18, has a structure in which the light-absorbent film 16, the silicon dioxide film 17, the light-absorbent film 16 and the silicon dioxide film 17 are laminated in sequence from the lower layer side.

In the example of FIG. 1, the tantalum pentaoxide contained film 15 and the light-absorbent film 16 in the multilayer anti-reflection film are represented using the same reference numerals as in the case of one-layer structure.

Figure 2:
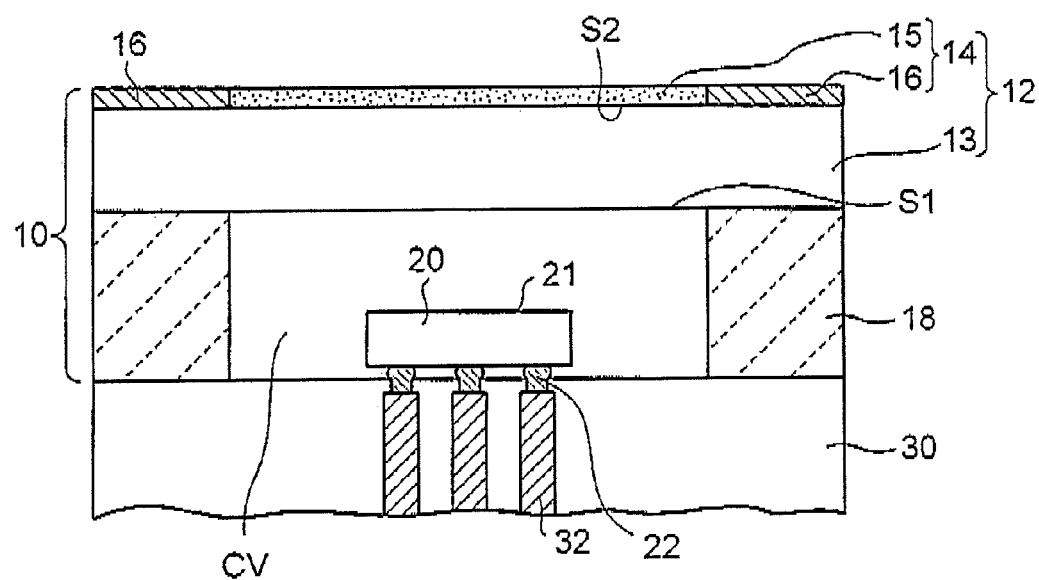
FIG. 2 is a cross-sectional view illustrating an example of application of the cap for optical device illustrated in FIG. 1 (a state where an optical device mounted on a substrate is sealed with the cap)

FIG. 2 illustrates in a cross-sectional view, an example of application of the cap 10 for optical device of the present embodiment (a state where an optical device mounted on a substrate is sealed with the cap 10).

In FIG. 2, reference numeral 20 denotes a light emitting element such as an LED (light-emitting diode); reference numeral 30 denotes a semiconductor (silicon) substrate; and reference numeral 32 denotes a piercing electrode (made of copper, aluminum or the like) formed piercing in the thickness direction at a required position of the semiconductor substrate 30 (a position corresponding to a portion in which the light emitting element 20 is mounted). The light emitting element 20 is mounted to be housed in the cavity CV formed by the plate-shaped member 12 and the frame-shaped member 18 in the cap 10.

The light emitting element 20 has a light emitting plane 21 on a surface side which faces the first surface S1 of the borosilicate glass 13 constituting the plate-shaped member 12, and has an electrode pad (not illustrated) on a surface opposite to the light emitting plane 21 (a surface which faces the semiconductor substrate 30). A conductor 22 such as solder bump, gold bump or the like, which is used as an electrode terminal when mounted on the semiconductor substrate 30, is bonded to the electrode pad of the light emitting element 20. The light emitting element 20 is electrically connected via the conductor 22 to one end of the piercing electrode 32 provided in the substrate 30. The other end of the piercing electrode 32 is electrically connected to an external terminal (not illustrated) formed on a surface on the opposite side of the substrate 30.

The cap 10 is mounted to seal the light emitting element 20 mounted on the substrate 30, with an adhesive layer (for example, a photo-curing or thermosetting resin such as epoxy resin, acrylic resin or the like) interposed between the bottom surface of the frame-shaped member 18 and the substrate 30.

In the example of FIG. 2, the light emitting element 20 and the cap 10 are mounted on the semiconductor substrate 30, but it is of course that the form of the mounting substrate is not restricted to the illustrated example. For example, a resin substrate used in a plastic package, a ceramic substrate used in a ceramic package, and the like, may be used. Moreover, the optical device to be mounted on the substrate is not restricted to the light emitting element 20, and a light receiving element such as a photodiode (PD) or the like may be mounted.

Figure 3A:
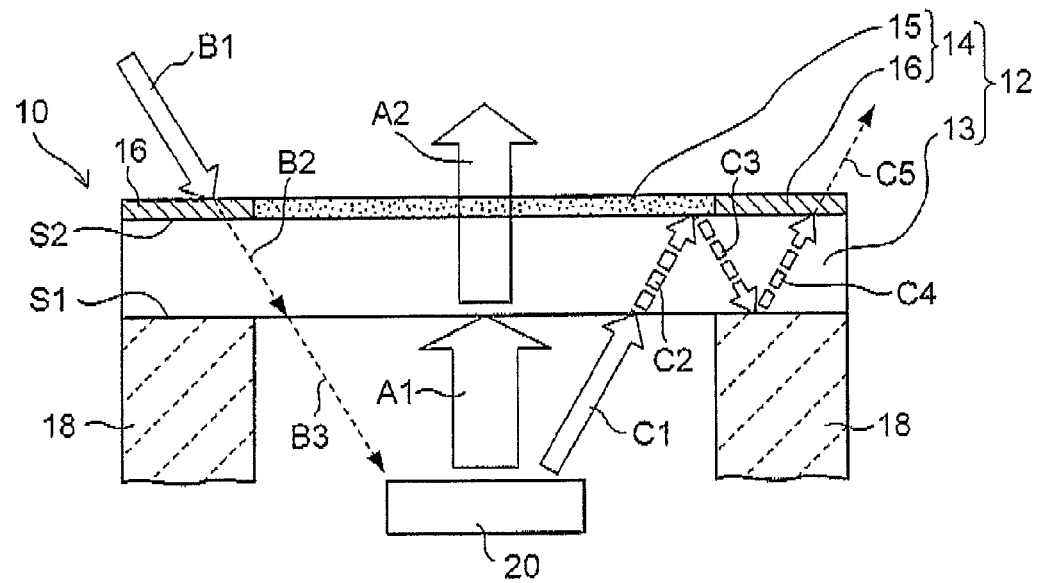
FIGS. 3A and 3B are cross-sectional views illustrating the effects obtained by the cap for optical device illustrated in FIG. 1, in comparison with the case of a comparative example.
Figure 3B:
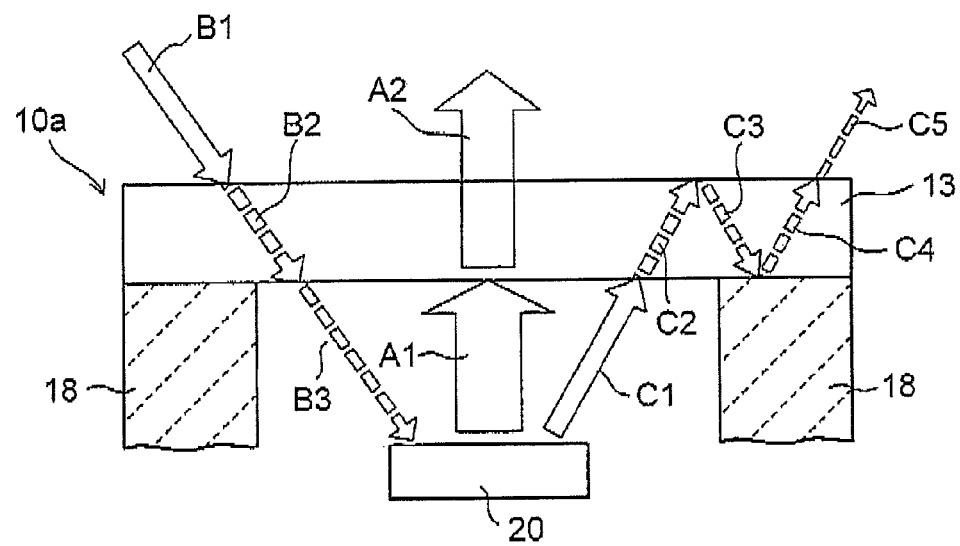

FIGS. 3A and 3B illustrate the effects obtained by the cap 10 for optical device of the embodiment (FIG. 3A), in comparison with the case of a comparative example (FIG. 3B).

In FIG. 3A, A1 indicated by an arrow represents an effective emitted light which should be utilized in the original purpose, of the light emitted from the light emitting element 20, and A2 represents a light that the emitted light A1 transmits the glass 13 and the tantalum pentaoxide contained film 15 and is output to the external. Moreover, B1 indicated by an arrow represents an unnecessary light (external light) which is entered from the external; B2 represents a light that the external light B1 transmits the light-absorbent film 16 and travels in the glass 13; and B3 represents a light that the light B2 transmits the glass 13 and is entered into the light emitting element 20. Moreover, C1 indicated by an arrow represents an unnecessary emitted light which is not utilized in the original purpose, of the light emitted from the light emitting element 20; C2 represents a light that the emitted light C1 is entered into the glass 13 and travels in the glass 13; C3 represents a light that the light C2 is reflected on the second surface S2 of the glass 13 and travels in the glass 13; C4 represents a light that the light C3 is reflected on the first surface S1 of the glass 13 and travels in the glass 13; and C5 represents a light that the light C4 transmits the glass 13 and the light-absorbent film 16 and is output to the external.

Likewise, in the comparative example illustrated in FIG. 3B, the components of light corresponding to those in FIG. 3A are indicated by the same reference marks A1, A2, B1, B2, B3, C1, C2, C3, C4 and C5. Note in the cap 10a for optical device of the comparative example, the borosilicate glass 13 constitutes the plate-shaped member 12, and both surfaces of the glass 13 (except for the portion to which the frame-shaped member 18 is joined) are exposed.

In the configuration of the cap 10a for optical device of the comparative example (FIG. 3B), the joined portion of the glass 13 and the frame-shaped member (silicon) 18 is optically transparent. Accordingly, problems arise in that unnecessary reflection of light occurs at the joined portion and thus the optical characteristics are deteriorated.

For example, the unnecessary light C1 emitted from the light emitting element 20 is entered into the glass 13 and travels in the glass 13 (C2), and is reflected on the upper surface of the glass 13 (C3). Then the reflected light C3 is reflected on the lower surface of the glass 13, i.e., on the interface between the glass 13 and the silicon 18 (C4), and the reflected light C4 transmits the glass 13 and is output to the external (C5). As a result, the undesirable light C5 exerts a considerable influence on other optical devices disposed near the cap 10a. This leads to a deterioration in the optical characteristics of the entire cap 10a inclusive of the light emitting element 20.

Moreover, the unnecessary light (external light) B1 entered from the external is entered into the glass 13 and travels in the glass 13 (B2), and the light B2 transmits the glass 13 and is entered into the light emitting element 20 (B3). Namely, the undesirable external light B3 is entered into the light emitting plane of the light emitting element 20 and thus a considerable influence is exerted. In this case too, the optical characteristics are deteriorated.

Contrary to this, according to the configuration of the cap 10 for optical device of the embodiment (FIG. 3A), the light-absorbent film 16 is formed in the specific portion (the portion positioned above the frame-shaped member 18) of the anti-reflection film 14 formed on the second surface S2 of the borosilicate glass 13. Namely, the embodiment realizes the structure in which the portion not optically transparent (the light-absorbent film 16) is present above the joined portion of the glass 13 and the frame-shaped member (silicon) 18 and thus an unnecessary reflection of light is hard to occur at the portion.

By this structure, as for the unnecessary light (external light) B1 entered from the external, most of the amount of light is absorbed by the light-absorbent film 16. Accordingly, the light B2 which transmits the light-absorbent film 16 and is entered into the glass 13, and the light B3 which transmits the glass 13 and is entered into the light emitting element 20, are greatly reduced. As a result, it is possible to decrease the influences exerted by incidence of the undesirable external light B3 on the light emitting plane of the light emitting element 20. This contributes to an improvement in the optical characteristics of the entire cap 10 inclusive of the light emitting element 20.

Moreover, as for the unnecessary light C1 emitted from the light emitting element 20, it is entered into the glass 13 and travels in the glass 13 (C2), and is reflected on the second surface S2 of the glass 13 (C3). Then the reflected light C3 is reflected on the first surface S1 of the glass 13, on the interface between the glass 13 and the silicon 18 (C4), but most of the amount of the reflected light C4 is absorbed by the light-absorbent film 16. Accordingly, the light C5 which transmits the light-absorbent film 16 and is output to the external, is greatly reduced. As a result, it is possible to decrease the influences exerted on other optical devices disposed near the cap 10, by the undesirable light C5. In this case too, the optical characteristics can be improved.

Second Embodiment

Figure 4A:
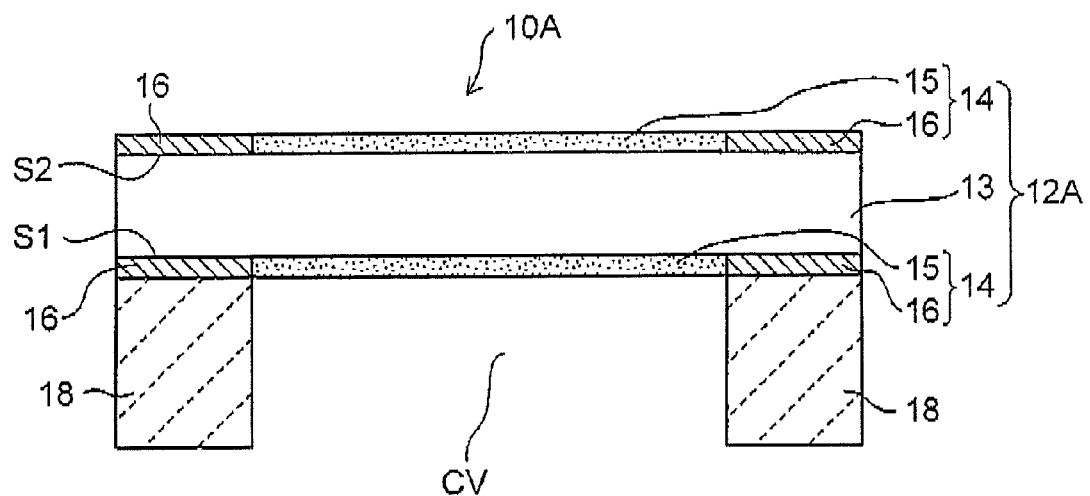
FIGS. 4A and 4B are cross-sectional views illustrating a configuration of a cap for optical device (frame-attached anti-reflection glass) according to a second embodiment, and the effects obtained by the cap for optical device.
Figure 4B:
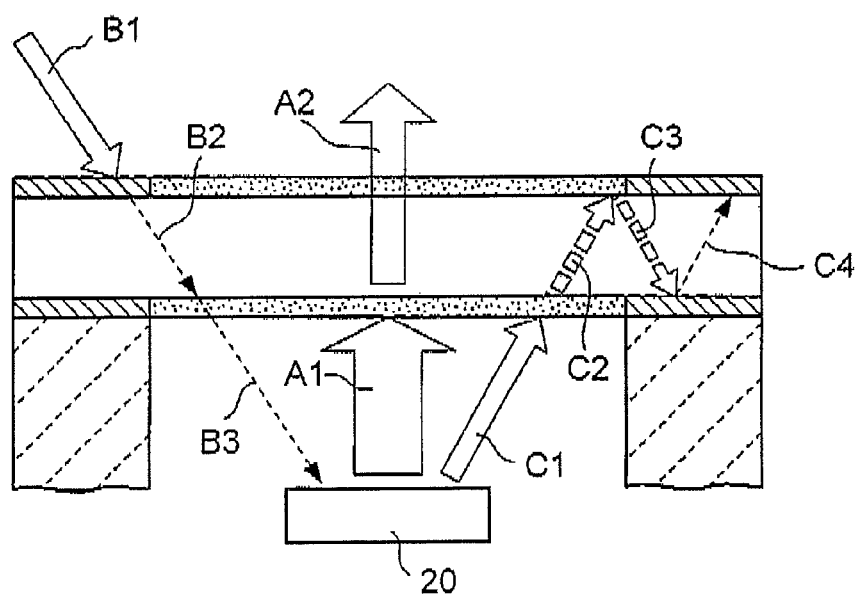

FIG. 4A illustrates in a cross-sectional view, a configuration of a cap for optical device as the frame-attached anti-reflection glass according to a second embodiment. FIG. 4B illustrates the effects obtained by the cap for optical device.

The cap 10A for optical device of the second embodiment is different from the cap 10 for optical device of the first embodiment (FIG. 1) in that the anti-reflection film 14 (the tantalum pentaoxide contained film 15 and the light-absorbent film 16) is formed respectively on both surfaces S1, S2 of the borosilicate glass 13 constituting the plate-shaped member 12A. More specifically, the light-absorbent film 16 is formed also in a portion on the first surface S1 of the borosilicate glass 13, which is in contact with the frame-shaped member (silicon) 18. The other configuration is the same as that in the first embodiment (the cap 10) and thus the explanation thereof is omitted.

According to the configuration of the cap 10A for optical device of the second embodiment, the portion not optically transparent (the light-absorbent film 16) is present also in the joined portion of the glass 13 and the silicon 18 (on the first surface S1 side of the glass 13), in addition to the portion positioned above the joined portion (on the second surface S2 side of the glass 13). As a result, an advantage is obtained in that it is possible to further improve the optical characteristics, compared with the first embodiment (the cap 10).

More specifically, according to the first embodiment (see FIG. 3A), the silicon 18 is in direct contact with the first surface S1 of the glass 13, and accordingly, the light C3 entered on the interface is reflected with substantially the same intensity of light (the reflected light C4). Contrary to this, according to the second embodiment (FIGS. 4A and 4B), most of the amount of the light C3 entered on the joined portion of the glass 13 and the silicon 18 (on the interface between the glass 13 and the light-absorbent film 16) is absorbed by the light-absorbent film 16, and thus the reflected light C4 is greatly reduced. Furthermore, the reflected light C4 is absorbed by the light-absorbent film 16 on the opposite side (on the second surface S2 side) of the glass 13, and accordingly, it is possible to prevent undesirable light (the light C5 depicted in FIG. 3A) from being output to the external. As a result, it is possible to remove the influences exerted on other optical devices disposed near the cap 10A, and thus to contribute to a further improvement in the optical characteristics.

Third Embodiment

Figure 5A:
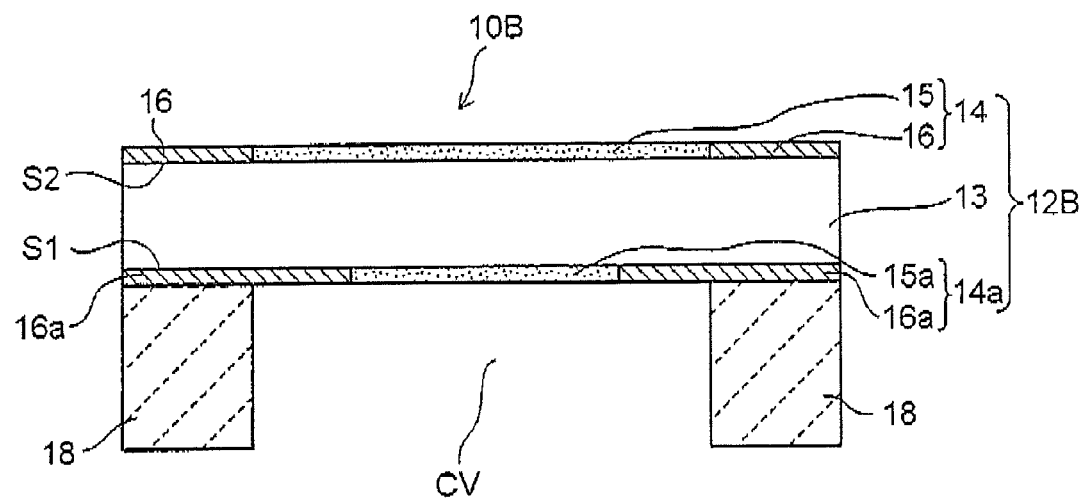
FIGS. 5A and 5B are cross-sectional views illustrating a configuration of a cap for optical device (frame-attached anti-reflection glass) according to a third embodiment, and the effects obtained by the cap for optical device.
Figure 5B:
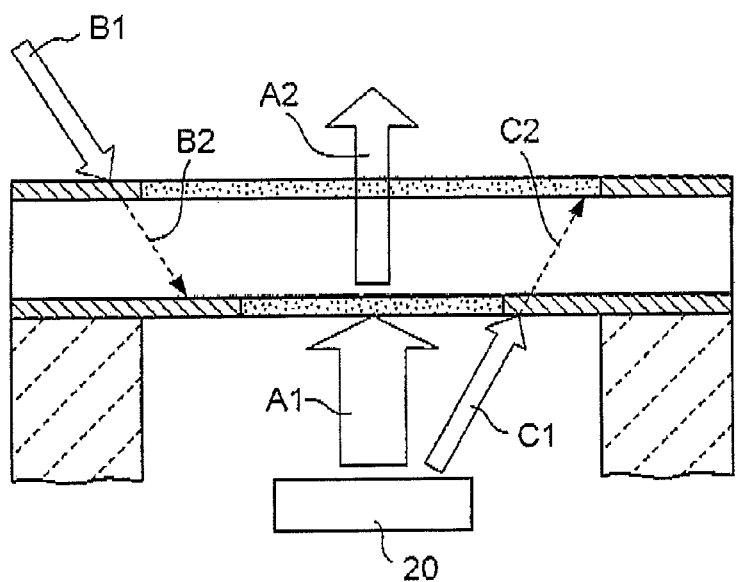

FIG. 5A illustrates in a cross-sectional view, a configuration of a cap for optical device as the frame-attached anti-reflection glass according to a third embodiment. FIG. 5B illustrates the effects obtained by the cap for optical device.

The cap 10B for optical device of the third embodiment is different from the cap 10A for optical device of the second embodiment (FIG. 4A) in that the formation region of the light-absorbent film 16a formed on the first surface S1 of the borosilicate glass 13 is extended by a predetermined range toward the inner side direction from the region on the frame-shaped member (silicon) 18. The predetermined range depends upon the relationship of positions between the light emitting element 20 and the plate-shaped member 12B. Basically the predetermined range is selected to a range enough to cross an extension line in the direction in which the unnecessary light (external light) B1 entered from the external travels, and an extension line in the direction in which the unnecessary light C1 emitted from the light emitting element 20 travels, respectively. The other configuration is the same as that in the second embodiment (the cap 10A) and thus the explanation thereof is omitted.

According to the configuration of the cap 10B for optical device of the third embodiment, the portion not optically transparent (the light-absorbent film 16a) is present also in the portion extended toward the inner side direction from the region on the silicon 18 on the first surface S1 side of the glass 13. As a result, an advantage is obtained in that it is possible to further improve the optical characteristics, compared with the second embodiment (the cap 10A).

More specifically, according to the second embodiment (FIGS. 4A and 4B), most of the amount of the unnecessary light (external light) B1 entered from the external is absorbed by the light-absorbent film 16 on the second surface S2 side of the glass 13. However, part of the unnecessary light B1, i.e., the light B2 which transmits the light-absorbent film 16 and is entered into the glass 13, transmits the glass 13 and is entered into the light emitting element 20 (incident light B3), because the formation region of the light-absorbent film 16 formed on the first surface S1 of the glass 13 is only the region on the silicon 18. Contrary to this, according to the third embodiment (FIGS. 5A and 5B), the light B2 entered into the glass 13 is absorbed by the light-absorbent film 16a formed extending toward the inner side direction on the first surface S1 of the glass 13. Accordingly, it is possible to prevent undesirable light (the incident light B3 depicted in FIG. 4B) from being entered into the light emitting element 20. As a result, it is possible to remove the influences exerted on the light emitting element 20, and thus to contribute to a further improvement in the optical characteristics.

Moreover, according to the third embodiment (FIGS. 5A and 5B), most of the amount of the unnecessary light C1 emitted from the light emitting element 20 is absorbed by the light-absorbent film 16a extended on the first surface S1 of the glass 13. Accordingly, it is possible to greatly reduce the amount of the light C2 entered into the glass 13 and thus to prevent reflection of the light C2 in the glass 13. As a result, it is possible to certainly prevent undesirable light from being output to the external, and thus to remove the influences exerted on other optical devices disposed near the cap 10B (further improvement in the optical characteristics).

Manufacturing Method of the Cap for Optical Device According to Each of the Above Embodiments Hereinafter, methods of manufacturing the respective caps 10, 10A, 10B for optical device according to the above first to third embodiments will be explained with reference to FIGS. 6A to 10C.

Figure 6A:
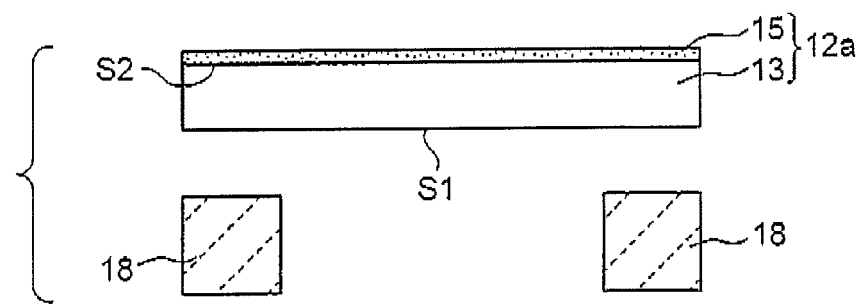
FIGS. 6A to 6C are cross-sectional views illustrating one example of manufacturing steps of the cap for optical device illustrated in FIG. 1.
Figure 6B:
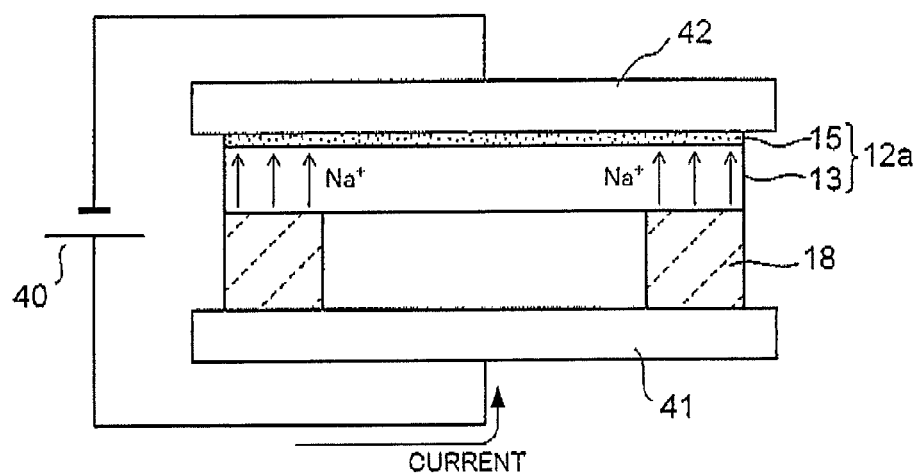
Figure 6C:
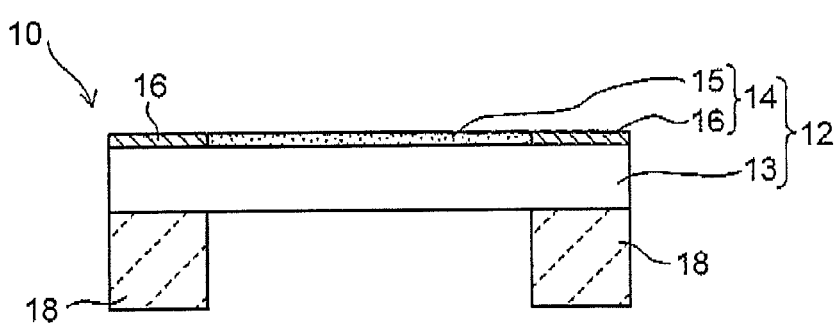

FIGS. 6A to 6C illustrate in a cross-sectional view, one example of manufacturing steps of the cap 10 (FIG. 1) for optical device according to the first embodiment.

In the initial step (FIG. 6A), as the members constituting the cap 10, a plate-shaped member 12a made of a material which can transmit light, and a frame-shaped member 18 made of silicon (Si), are prepared. The plate-shaped member 12a is obtained by forming a film 15 containing tantalum pentaoxide ($Ta_2O_5$) as its main component (tantalum pentaoxide contained film) on the second surface S2 of the borosilicate glass 13 (on the surface opposite to the surface S1 to which the frame-shaped member 18 is joined). The borosilicate glass 13 contains sodium (Na) which can become a movable ion when a predetermined bias voltage is applied across the both surfaces thereof, and the thickness thereof is selected to be, for example, approximately 0.2 to 0.5 mm.

The plate-shaped member 12a is obtained by forming on the borosilicate glass 13 shaped to a required thickness, for example, the tantalum pentaoxide contained film 15 using anodic oxidation method. The frame-shaped member 18 is obtained by preparing a silicon substrate of a size matching an outer shape of the plate-shaped member 12a, thinning the silicon substrate by a polishing machine or the like to a required thickness, and effecting a dry etching such as a reactive ion etching (RIE) or the like relative to the thinned silicon substrate to thereby form a through hole in a square shape.

In the next step (FIG. 6B), the frame-shaped member (silicon) 18 is superposed on the surface (first surface S1) of the plate-shaped member 12a on the side on which the glass 13 is formed, and both of the members are joined together by anodic bonding. More specifically, the superposed plate-shaped member 12a and frame-shaped member (silicon) 18 are heated at a temperature of 100 to 400° C. and then a regular bias voltage (approximately DC 100 to 1000 V) is applied across the both members, while applying an electrode 41, which is connected to the positive (+) pole of the direct current (DC) power source 40, to the bottom surface of the frame-shaped member (silicon) 18, and applying an electrode 42, which is connected to the negative (−) pole of the DC power source 40, to the surface of the tantalum pentaoxide contained film 15 of the plate-shaped member 12a.

By the application of the bias voltage, sodium ions (Na$^+$) in the borosilicate glass 13 are moved toward the negative (−) electrode 42 side. Then in the interface portion between the glass 13 and the frame-shaped member (silicon) 18, a layer in which positive (+) charges are collected is formed on the silicon 18 side, and a space charge layer of SiO$^−$ (a layer in which sodium ions are lacking) is formed on the glass 13 side. As a result, electrostatic attraction is generated at the interface between the glass 13 and the silicon 18, and thus the both members are covalent bonded.

Moreover, the sodium (Na) ions moved in the glass 13 are taken into a portion of the tantalum pentaoxide contained film 15 which is positioned above the frame-shaped member (silicon) 18. As a result, the portion of the tantalum pentaoxide contained film 15 is changed into a film containing sodium (Na), tantalum (Ta) and oxygen (O) (light-absorbent film 16). At this time, since the light-absorbent film 16 is formed due to the movement of sodium (Na) ions, it is probably formed in a larger (or smaller) range than the portion in which the frame-shaped member (silicon) 18 and one surface side (the first surface S1 side) of the glass 13 are in contact with each other.

In the multilayer anti-reflection film as well, it is possible to form a plurality of films 16 containing tantalum (Ta), sodium (Na) and oxygen (O), since sodium (Na) ion is transmitted through and moved in the silicon dioxide film. In this case, in the multilayer anti-reflection film, the tantalum pentaoxide contained film 15 of at least one layer is sufficient to have a film 16 containing Ta, Na and O. All of the tantalum pentaoxide contained films 15 are not necessarily changed to a film 16 containing Ta, Na and O.

Then, the application of the bias voltage is stopped and the electrodes 41 and 42 are detached. Thus the cap 10 for optical device of the first embodiment is manufactured (FIG. 6C).

According to the manufacturing method of the cap 10 for optical device illustrated in FIGS. 6A to 6C, there are obtained further merits below, in addition to the above advantages (improvement in the optical characteristics) based on the structure of the cap 10 for optical device.

Namely, in the state of the art, formation of a light-absorbent film on a glass is carried out, for example, as follows: First, a metal film having the property of absorbing light is formed using a CVD method or the like on the entire surface of a glass; an etching resist is then formed on the metal film; the resist layer is patterned into a required shape; the metal film is etched away using the patterned resist layer as a mask, to thereby form a light-absorbent film; and finally the resist layer is removed. Namely, a photolithography technique needs to be used.

Contrary to this, according to the manufacturing method of the cap 10 for optical device illustrated in FIGS. 6A to 6C, it is possible to easily form the light-absorbent film 16 by forming a required metal film (the tantalum pentaoxide contained film 15) on the borosilicate glass 13 and then, with the frame-shaped member (silicon) 18 being interposed between the glass 13 and the electrode 41, applying a predetermined negative (−) voltage to the metal film 15 to thereby effect an anodic bonding. More specifically, the light-absorbent film 16 can be formed only in a portion corresponding to the position at which the frame-shaped member (silicon) 18 and the glass 13 contacts with each other. Accordingly, masks or the like are unnecessary and the manufacturing process can be simplified. Namely, it is possible to carry out a required patterning without using a photolithography technique such as needed in the state of the art, and accordingly to realize a simplification of the manufacturing process and a reduction in the manufacturing cost.

Moreover, according to the manufacturing method of the cap 10 for optical device illustrated in FIGS. 6A to 6C, the tantalum pentaoxide contained film 15 is interposed between the borosilicate glass 13 and the negative (−) electrode 42, and sodium (Na) ions are taken into the film 15. Accordingly, unlike the case of an ordinary anodic bonding, it is possible to greatly reduce the amount of sodium (to be exact, sodium hydroxide) deposited on the negative (−) electrode. This is advantageous from the viewpoint of the maintenance of the electrodes.

FIGS. 7A to 8B illustrate in a cross-sectional view, one example of manufacturing steps of the cap 10A (FIG. 4A) for optical device according to the second embodiment.

In the initial step (FIG. 7A), as the members constituting the cap 10A, a plate-shaped member 12b made of a material which can transmit light, and a frame-shaped member 18 made of silicon (Si), are prepared. The plate-shaped member 12b is obtained by forming a tantalum pentaoxide contained film 15 on both surfaces S1, S2 of the borosilicate glass 13, respectively. The material of the borosilicate glass 13 and the thickness thereof, and the respective forming methods of the plate-shaped member 12b and the frame-shaped member (silicon) 18, are the same as those explained in the above step of FIG. 6A.

In the next step (FIG. 7B), the frame-shaped member (silicon) 18 is superposed on one surface of the plate-shaped member 12b (on the first surface S1 side of the glass 13 in the illustrated example) on the side on which the tantalum pentaoxide contained film 15 is formed, and then a reverse bias voltage, which is reverse to the regular bias voltage applied in the above step of FIG. 6B, is applied to the superposed plate-shaped member 12b and frame-shaped member (silicon) 18. More specifically, the reverse bias voltage (approximately DC 100 to 1000 V) is applied across the both members, while applying the electrode 41, which is connected to the negative (−) pole of the DC power source 40, to the bottom surface of the frame-shaped member (silicon) 18, and applying the electrode 42, which is connected to the positive (+) pole of the DC power source 40, to the surface of the tantalum pentaoxide contained film 15 of the plate-shaped member 12b.

By the application of the reverse bias voltage, sodium ions (Na$^+$) in the borosilicate glass 13 are moved toward the negative (−) electrode 41 side. The sodium (Na) ions moved in the glass 13 are taken into a portion of the tantalum pentaoxide contained film 15 which corresponds to the position of the frame-shaped member (silicon) 18. As a result, the portion of the tantalum pentaoxide contained film 15 is changed into a film containing sodium (Na), tantalum (Ta) and oxygen (O) (light-absorbent film 16). At this time, no electrostatic attraction is generated at the interface between the glass 13 and the silicon 18, and accordingly, the glass 13 and the silicon 18 are not in a joined state.

Figure 7A:
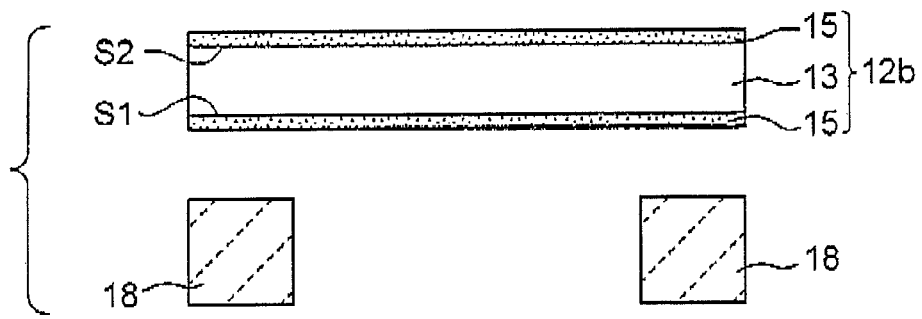
FIGS. 7A to 7C are cross-sectional views illustrating one example of manufacturing steps of the cap for optical device illustrated in FIG. 4A.
Figure 7B:
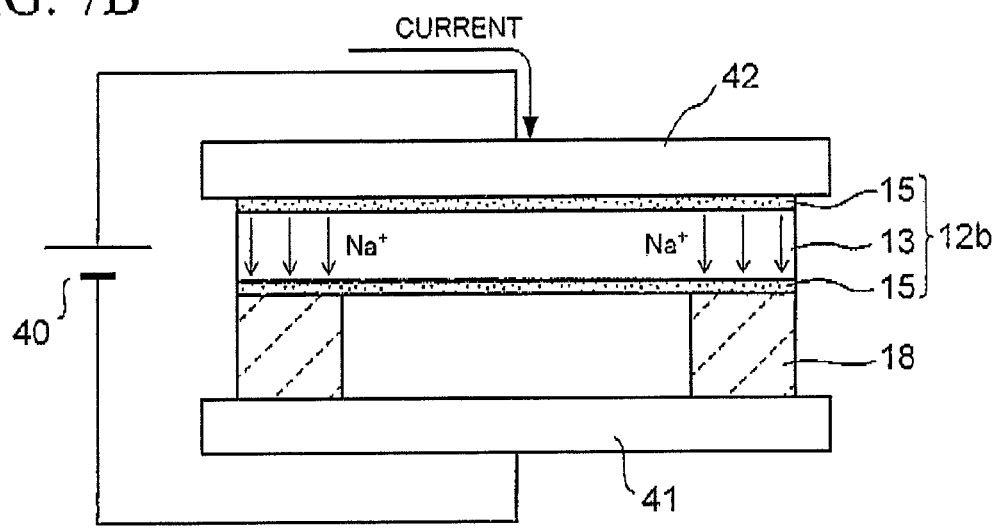
Figure 7C:
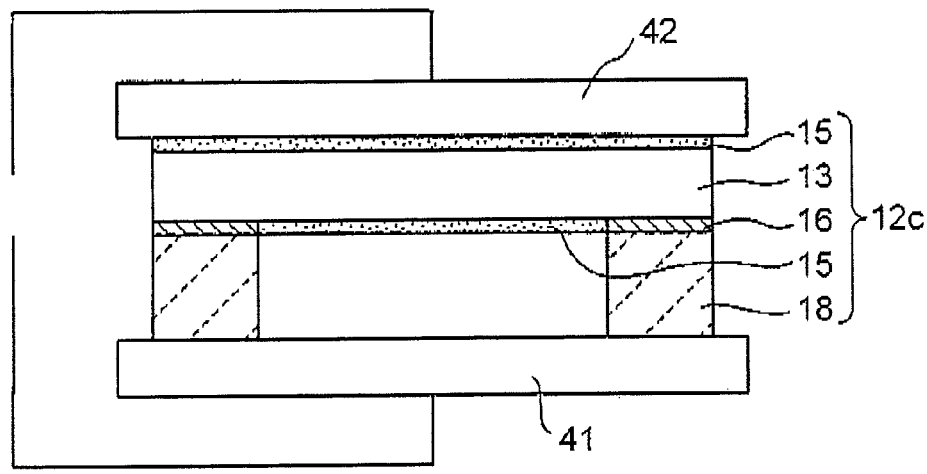

Then, the application of the reverse bias voltage is stopped and thus an intermediate body 12c is obtained as illustrated in FIG. 7C. At this time, the intermediate body 12c is held between the electrodes 41 and 42 because the glass 13 and the silicon 18 are not yet in a joined state.

In the next step (FIG. 8A), the regular bias voltage is applied across the intermediate body 12c in the same manner as in the above step of FIG. 6B, and thus both of the members 13, 18 are joined together by anodic bonding. At this time, electrostatic attraction is generated at the interface between the light-absorbent film 16 on the glass 13 and the silicon 18, and thus the both members are covalent bonded.

Moreover, the sodium (Na) ions moved in the glass 13 are taken into a portion of the tantalum pentaoxide contained film 15 which is positioned above the frame-shaped member (silicon) 18. As a result, the portion of the tantalum pentaoxide contained film 15 is changed into a film containing sodium (Na), tantalum (Ta) and oxygen (O) (light-absorbent film 16).

Then, the application of the regular bias voltage is stopped and the electrodes 41 and 42 are detached. Thus the cap 10A for optical device of the second embodiment is manufactured (FIG. 8B).

According to the manufacturing method of the cap 10A for optical device illustrated in FIGS. 7A to 8B, it is possible to realize a reduction in the manufacturing cost and also to greatly reduce the amount of sodium hydroxide deposited on the negative (−) electrode, in the like manner as in the case of the above manufacturing method of FIGS. 6A to 6C.

Figure 9A:
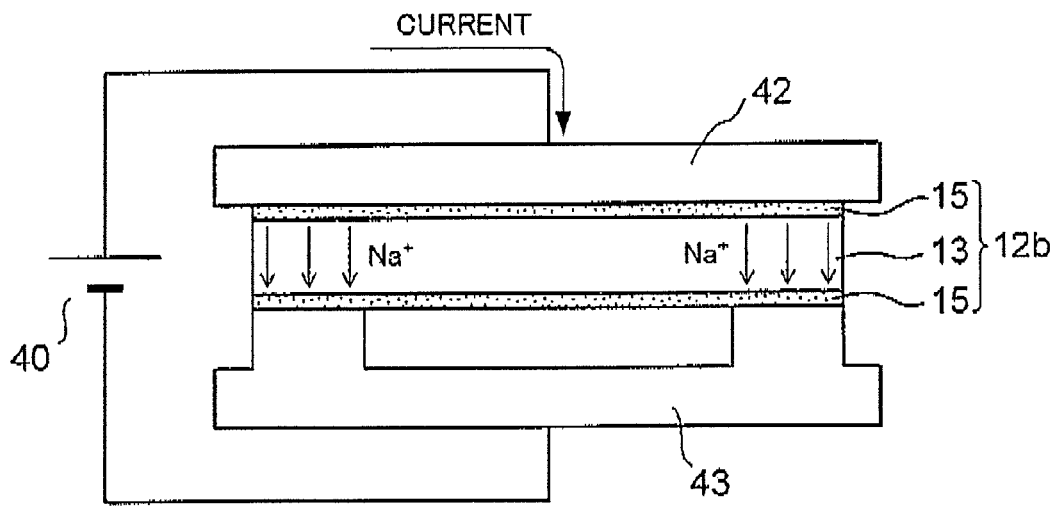
FIGS. 9A to 9C are cross-sectional views illustrating another example of manufacturing steps of the cap for optical device illustrated in FIG. 4A.
Figure 9B:
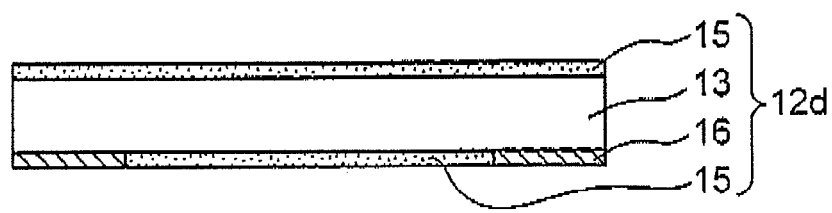
Figure 9C:
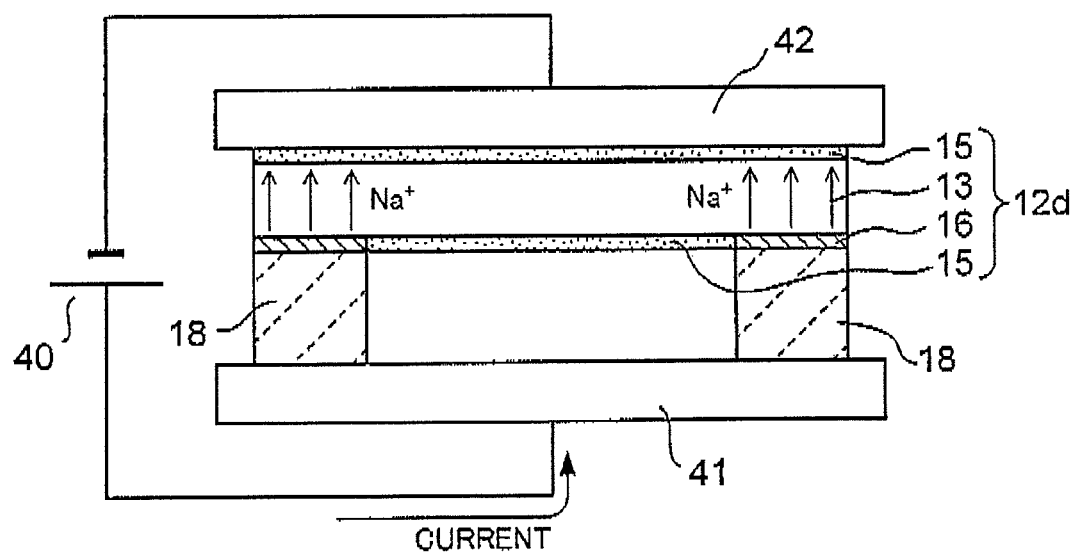

FIGS. 9A to 9C illustrate in a cross-sectional view, another example of manufacturing steps of the cap 10A (FIG. 4A) for optical device according to the second embodiment.

In the initial step (FIG. 9A), the members constituting the cap 10A (a plate-shaped member 12b made of a material which can transmit light, and a frame-shaped member 18 made of silicon (Si)) are prepared in the same manner as in the above step of FIG. 7A. Note in the present step, only the plate-shaped member 12b (in which the tantalum pentaoxide contained films 15 are formed on both surfaces of the borosilicate glass 13, respectively) is used.

Next, a predetermined bias voltage is applied across the both surfaces of the plate-shaped member 12b. In this case, as for one electrode which is to be connected to the positive (+) pole of the DC power source 40, the same one as the electrode 42 used in the above step of FIG. 7B is used. As for the other electrode which is to be connected to the negative (−) pole of the DC power source 40, an electrode 43 with a specific shape, which exhibits a concave shape when viewed in cross section as illustrated in FIG. 9A, is used.

The electrode 43 on the negative (−) pole side is patterned such that the electrode surface of a portion to be in contact with the tantalum pentaoxide contained film 15 exhibits a predetermined shape. The predetermined shape is, for example, a shape corresponding to a square ring shape of the frame-shaped member 18 when viewed in plan. The electrode 43 on the negative (−) pole side is referred to as "pattern electrode" for convenience' sake.

More specifically, the predetermined bias voltage (approximately DC 100 to 1000 V) is applied across the plate-shaped member 12b, while applying the electrode 42 on the positive (+) pole side to the entire surface of the one tantalum pentaoxide contained film 15 of the plate-shaped member 12b, and applying the pattern electrode 43 on the negative (−) pole side to a portion of the surface of the other tantalum pentaoxide contained film 15 of the plate-shaped member 12b.

By the application of the bias voltage, sodium ions (Na$^+$) in the borosilicate glass 13 are moved toward the pattern electrode 43 side. The sodium (Na) ions moved in the glass 13 are taken into a portion of the tantalum pentaoxide contained film 15 which corresponds to the position in contact with the pattern electrode 43. As a result, the portion of the tantalum pentaoxide contained film 15 is changed into a film containing sodium (Na), tantalum (Ta) and oxygen (O) (light-absorbent film 16).

Then, the application of the bias voltage is stopped and the electrodes 42 and 43 are detached. Thus an intermediate body 12d is obtained as illustrated in FIG. 9B.

Figure 8A:
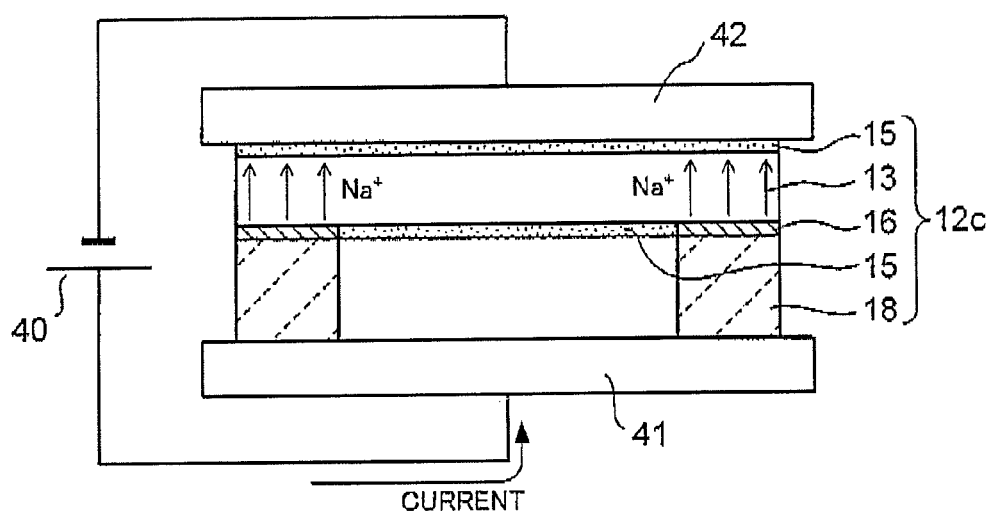
FIGS. 8A and 8B are cross-sectional views illustrating manufacturing steps subsequent to the steps of FIGS. 7A to 7C.
Figure 8B:
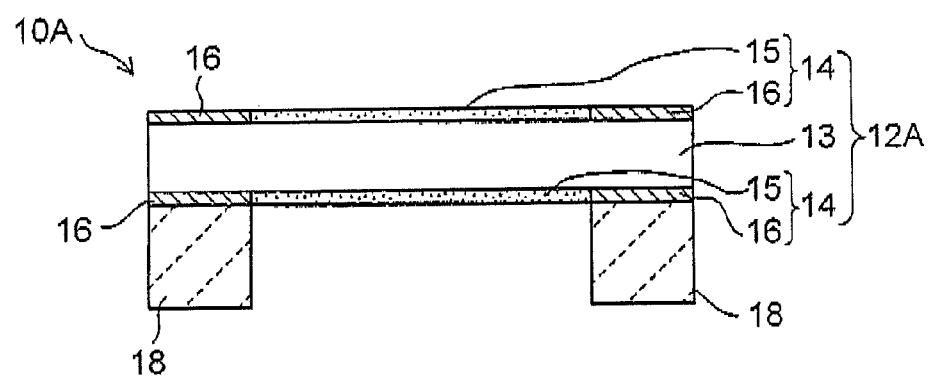

In the next step (FIG. 9C), the frame-shaped member (silicon) 18 is superposed on the surface of the intermediate body 12d on the side on which the light-absorbent film 16 is formed, and then a regular bias voltage is applied across the superposed intermediate body 12d and frame-shaped member (silicon) 18 in the same manner as in the above step of FIG. 8A. Thus the both members 18, 12d are joined together by anodic bonding. The subsequent steps are the same as those of FIGS. 8A and 8B, and thus the explanation thereof is omitted.

Finally, the application of the bias voltage is stopped and the electrodes 41 and 42 are detached. Thus the cap 10A for optical device of the second embodiment is manufactured.

According to the manufacturing method of the cap 10A for optical device illustrated in FIGS. 9A to 9C, it is possible to form the light-absorbent film 16 in an arbitrary shape corresponding to the electrode pattern (the shape of the pattern electrode 43). Accordingly, the light-absorbent film 16 can be formed in a simplified manner and at a low cost, compared with the conventional forming method.

Moreover, the light-absorbent film 16 on one surface side is formed in the step (FIG. 9A) separate from the step (FIG. 8A) in which the light-absorbent film 16 on the other surface side is formed by anodic bonding. Accordingly, it is possible to use a conventional anodic bonding apparatus in the separate step and thus to realize a simplification of the equipment.

Figure 10A:
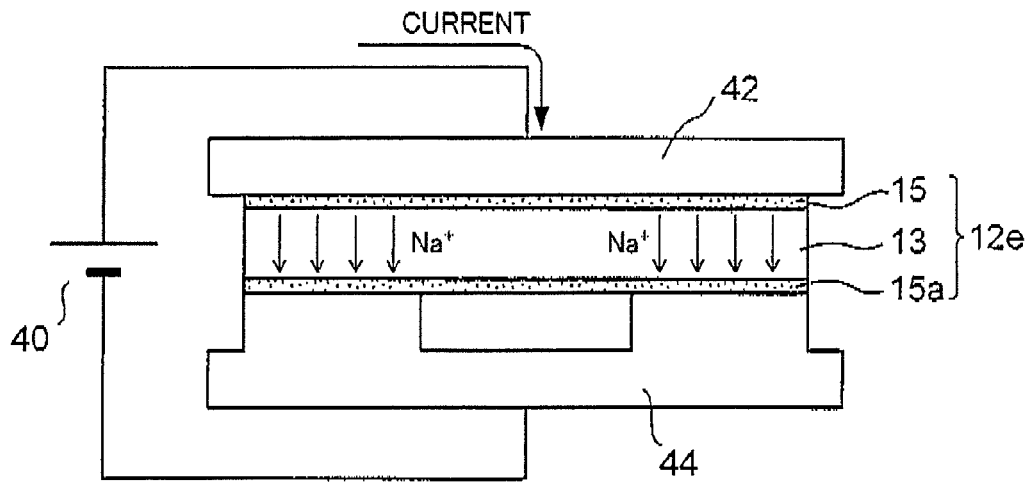
FIGS. 10A to 10C are cross-sectional views illustrating one example of manufacturing steps of the cap for optical device illustrated in FIG. 5A.
Figure 10B:
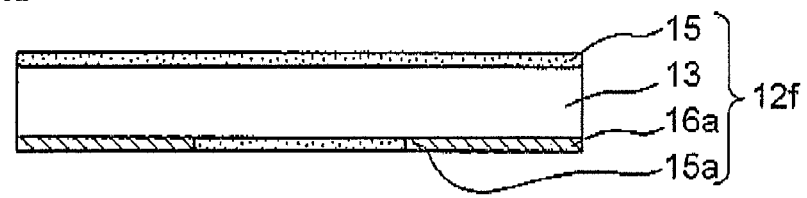
Figure 10C:
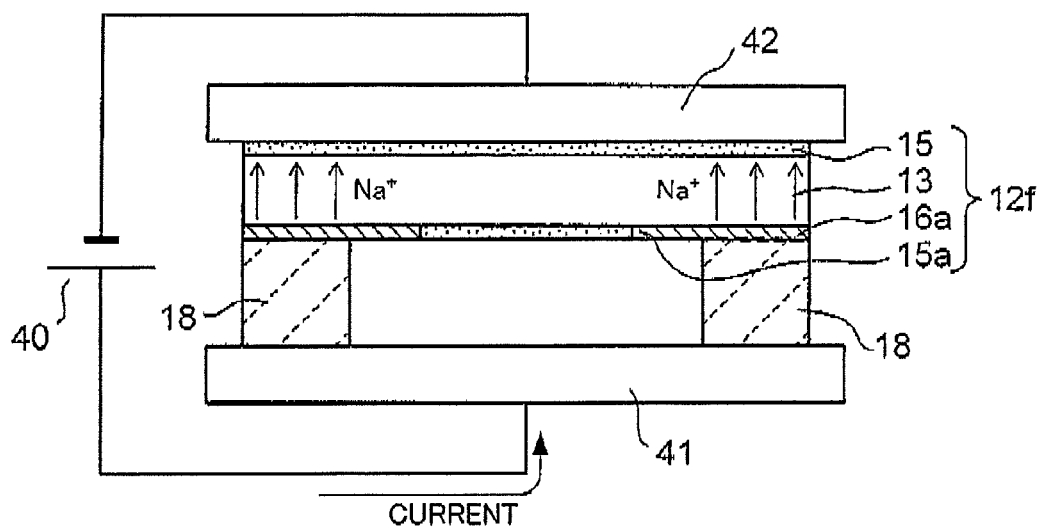

FIGS. 10A to 10C illustrate in a cross-sectional view, one example of manufacturing steps of the cap 10B (FIG. 5A) for optical device according to the third embodiment.

In the initial step (FIG. 10A), the members constituting the cap 10B (a plate-shaped member 12e made of a material which can transmit light, and a frame-shaped member 18 made of silicon (Si)) are prepared in the same manner as in the above step of FIG. 7A. Note in the present step, only the plate-shaped member 12e (in which the tantalum pentaoxide contained films 15, 15a are formed on both surfaces of the borosilicate glass 13, respectively) is used.

Next, a predetermined bias voltage is applied across the both surfaces of the plate-shaped member 12e. In this case, as for one electrode which is to be connected to the positive (+) pole of the DC power source 40, the same one as the electrode 42 used in the above step of FIG. 7B is used. As for the other electrode which is to be connected to the negative (−) pole of the DC power source 40, a pattern electrode 44 similar to the pattern electrode 43 used in the above step of FIG. 9A is used.

Note the shape of the electrode surface (the portion to be in contact with the tantalum pentaoxide contained film 15a) of the pattern electrode 44 used in the present step is patterned such that the shape, which corresponds to a square ring shape of the frame-shaped member 18 when viewed in plan, is extended by a predetermined range toward the inner side direction.

More specifically, the predetermined bias Voltage (approximately DC 100 to 1000 V) is applied across the plate-shaped member 12e, while applying the electrode 42 on the positive (+) pole side to the entire surface of the one tantalum pentaoxide contained film 15 of the plate-shaped member 12e, and applying the pattern electrode 44 on the negative (−) pole side to a portion of the surface of the other tantalum pentaoxide contained film 15a of the plate-shaped member 12e.

By the application of the bias voltage, sodium ions (Na$^+$) in the borosilicate glass 13 are moved toward the pattern electrode 44 side. The sodium (Na) ions moved in the glass 13 are taken into a portion of the tantalum pentaoxide contained film 15a which corresponds to the position in contact with the pattern electrode 44. As a result, the portion of the tantalum pentaoxide contained film 15a is changed into a film containing sodium (Na), tantalum (Ta) and oxygen (O) (light-absorbent film 16).

Then, the application of the bias voltage is stopped and the electrodes 42 and 44 are detached. Thus an intermediate body 12f is obtained as illustrated in FIG. 10B.

In the next step (FIG. 10C), the frame-shaped member (silicon) 18 is superposed on the surface of the intermediate body 12f on the side on which the light-absorbent film 16a is formed, and then a regular bias voltage is applied across the superposed intermediate body 12f and frame-shaped member (silicon) 18 in the same manner as in the above step of FIG. 8A. Thus the both members 18, 12f are joined together by anodic bonding. The subsequent steps are the same as those of FIGS. 8A and 8B, and thus the explanation thereof is omitted.

Finally, the application of the bias voltage is stopped and the electrodes 41 and 42 are detached. Thus the cap 10B for optical device of the third embodiment is manufactured.

According to the manufacturing method of the cap 10B for optical device illustrated in FIGS. 10A to 10C, it is possible to form the light-absorbent film 16a in an arbitrary shape corresponding to the electrode pattern (the shape of the pattern electrode 44), in the same manner as in the manufacturing method illustrated in FIGS. 9A to 9C. Accordingly, the light-absorbent film 16a can be formed in a simplified manner and at a low cost, compared with the conventional forming method.

Moreover, the light-absorbent film 16a on one surface side is formed in the step (FIG. 10A) separate from the step (FIG. 8A) in which the light-absorbent film 16 on the other, surface side is formed by anodic bonding. Accordingly, it is possible to use a conventional anodic bonding apparatus in the separate step and thus to realize a simplification of the equipment.

Figure 11A:
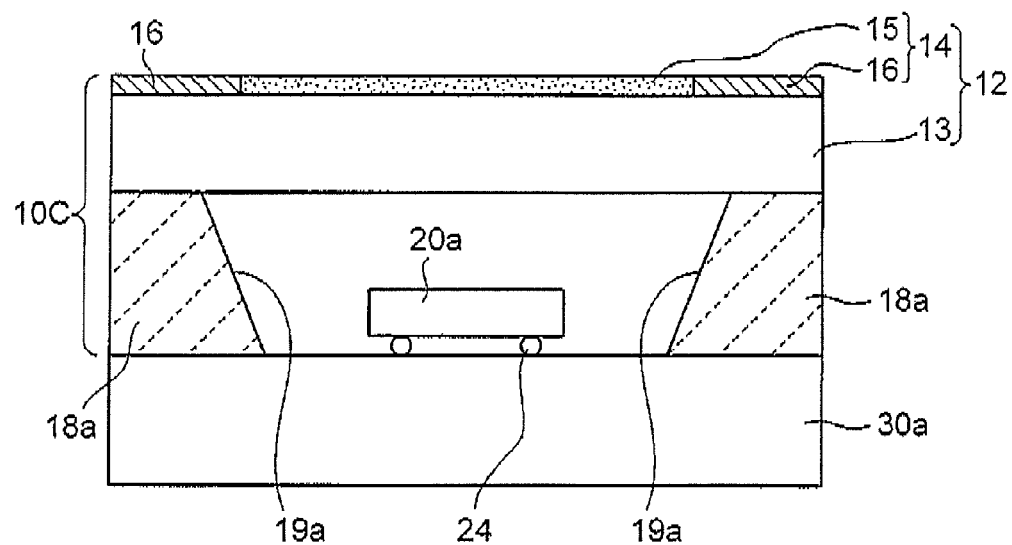
FIGS. 11A and 11B are cross-sectional views each illustrating an example of application of a cap for optical device (frame-attached anti-reflection glass) according to another embodiment.
Figure 11B:
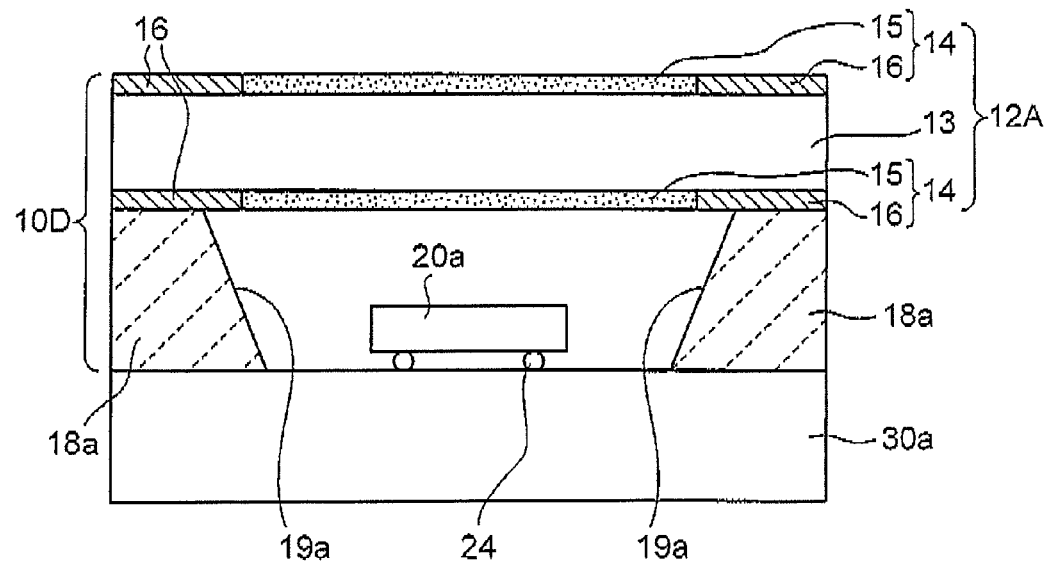

FIGS. 11A and 11B each illustrate in a cross-sectional view, an example of application of a cap for optical device according to another embodiment (a state where an optical device mounted on a substrate is sealed with the cap).

In the configuration of a cap 100 for optical device illustrated in FIG. 11A, the frame-shaped member (silicon) 18a has an inclined surface (tapered portion) 19a on the side surface thereof on the light emitting element 20a side. The light emitting element 20a is electrically connected via a conductor 24 such as a solder bump or the like to a conductor (not illustrated) on a semiconductor substrate 30a (flip-chip bonding). Moreover, the light emitting element 20a has a light emitting plane on the side surface thereof. A light emitted from the light emitting element 20a is reflected on the tapered portion 19a of the frame-shaped member 18a, then transmits the glass 13 and the anti-reflection film (the tantalum pentaoxide contained films 15), and is output to the external. Accordingly, an appropriate metal film is preferably formed on the tapered portion 19a of the frame-shaped member 18a, so as to improve the characteristics of reflection. The other configuration is the same as that in the first embodiment (the cap 10) and thus the explanation thereof is omitted.

In the configuration of a cap 10D for optical device illustrated in FIG. 11B, the tapered portion 19a is provided on the side surface of the frame-shaped member (silicon) 18a on the light emitting element 20a side, in the same manner as in the cap 10C of FIG. 11A. The other configuration is the same as that in the second embodiment (the cap 10A) and thus the explanation thereof is omitted.

According to the embodiments illustrated in FIGS. 11A and 11B, it is possible to direct the light emitted from the light emitting element 20a, to a desirable direction, by utilizing the tapered portion 19a provided in the frame-shaped member (silicon) 18a.

Figure 12A:
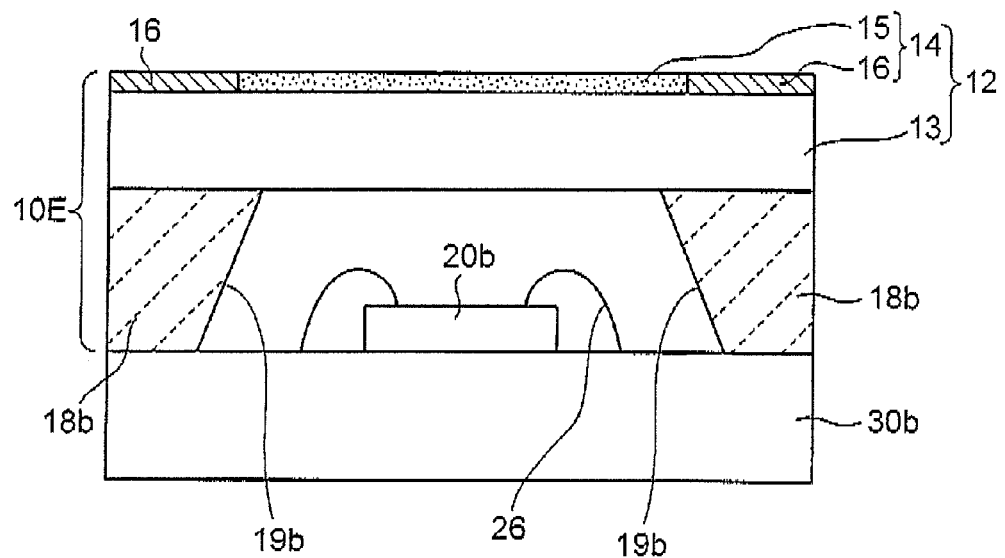
FIGS. 12A and 12B are cross-sectional views each illustrating an example of application of a cap for optical device (frame-attached anti-reflection glass) according to still another embodiment.
Figure 12B:
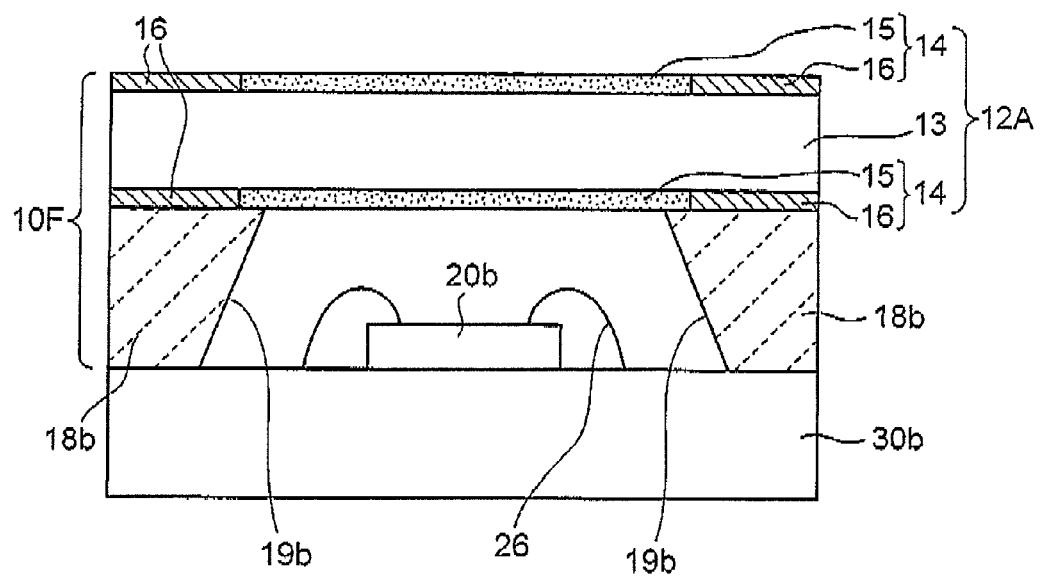

FIGS. 12A and 12B each illustrate in a cross-sectional view, an example of application of a cap for optical device according to still another embodiment (a state where an optical device mounted on a substrate is sealed with the cap).

In the configuration of a cap 10E for optical device illustrated in FIG. 12A, the frame-shaped member (silicon) 18b has an inclined surface (tapered portion) 19b, which is reverse in the up and down direction compared with the case of FIG. 11A, on the side surface thereof on the light emitting element 20b side. The light emitting element 20b is electrically connected via a wire 26 to a conductor (not illustrated) on a semiconductor substrate 30b (wire bonding connection). Moreover, the light emitting element 20b has a light emitting plane on the surface on the side to which the wire 26 is connected (on the upper side in the illustrated example). Accordingly, a light emitted from the light emitting element 20b travels upwards, then transmits the glass 13 and the anti-reflection film (the tantalum pentaoxide contained films 15), and is output to the external. The other configuration is the same as that in the first embodiment (the cap 10) and thus the explanation thereof is omitted.

In the configuration of a cap 10F for optical device illustrated in FIG. 12B, the tapered portion 19b, which is reverse in the up and down direction compared with the case of FIG. 11B, is provided on the side surface of the frame-shaped member (silicon) 18b on the light emitting element 20b side, in the same manner as in the cap 10E of FIG. 12A. The other configuration is the same as that in the second embodiment (the cap 10A) and thus the explanation thereof is omitted.

According to the embodiments illustrated in FIGS. 12A and 12B, it is possible to effectively cut an undesirable light of the light emitted from the light emitting element 20b, by presence of the tapered portion 19b formed on the side surface, on the light emitting element 20b side, of the frame-shaped member (silicon) 18b.

Although in the above embodiments, the explanation is given of the case where the frame-attached anti-reflection glass according to the invention is applied as a cap for optical device, the frame-attached anti-reflection glass can also be applied in the other uses. As an example, citing the gap 10 (FIG. 1) for optical device according to the first embodiment, it is possible to apply the cap 10 as an interference filter which transmits only light of a specific wavelength by using as a light-transmission film, the tantalum pentaoxide contained film 15 which is positioned above the cavity CV, of the two partial films 15, 16 which constitute the anti-reflection film 14 formed on the borosilicate glass 13.

Moreover, in the embodiment illustrated in FIGS. 7A to 8B, the polarity of the bias voltage applied in the step of FIG. 7B and the polarity of the bias voltage applied in the step of FIG. 8A may be reversed to the illustrated examples, respectively. Furthermore, in the respective embodiments illustrated in FIGS. 7A to 8B, FIGS. 9A to 9C, FIGS. 10A to 10C, FIG. 11B and FIG. 12B, the frame-shaped member (silicon) 18 may be joined after the light-absorbent film 16 (or 16a) is formed in advance on both surfaces of the glass 13, respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A frame-attached anti-reflection glass comprising:
a plate-shaped member including:
an anti-reflection film formed on at least one surface of a plate-shaped glass, the anti-reflection film including:
two partial films having different compositions, being continuously formed on at least one surface of the plate-shaped glass and having respective surfaces being on a level with each other; and
a frame-shaped member made of silicon joined to a peripheral portion on one surface side of the plate-shaped member,
wherein one of the two partial films is a light-absorbent film which is formed in at least a portion corresponding to a position of the frame-shaped member.

2. The frame-attached anti-reflection glass according to claim 1, wherein the light-absorbent film is formed extending toward an inner side direction from a region on the frame-shaped member.

3. The frame-attached anti-reflection glass according to claim 1, wherein the anti-reflection film is formed on both surfaces of the plate-shaped glass.

4. The frame-attached anti-reflection glass according to claim 1, wherein the light-absorbent film is a film containing tantalum, sodium and oxygen.

5. The frame-attached anti-reflection glass according to claim 1, wherein the plate-shaped glass is a borosilicate glass which contains at least sodium or lithium; the anti-reflection film includes a film containing tantalum pentaoxide as a main component; and the light-absorbent film is a film containing sodium tantalate or lithium tantalate.

* * * * *